United States Patent
Sperschneider et al.

(10) Patent No.: US 7,788,106 B2
(45) Date of Patent: Aug. 31, 2010

(54) ENTROPY CODING WITH COMPACT CODEBOOKS

(75) Inventors: Ralph Sperschneider, Erlangen (DE); Jürgen Herre, Buckenhof (DE); Karsten Linzmeier, Erlangen (DE); Johannes Hilpert, Nürnberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 986 days.

(21) Appl. No.: 11/251,485

(22) Filed: Oct. 14, 2005

(65) Prior Publication Data

US 2006/0235865 A1      Oct. 19, 2006

Related U.S. Application Data

(60) Provisional application No. 60/670,993, filed on Apr. 13, 2005.

(51) Int. Cl.
  *G10L 21/04* (2006.01)
  *H03M 7/40* (2006.01)
  *G06K 9/46* (2006.01)

(52) U.S. Cl. .................. 704/500; 704/501; 341/65; 382/246

(58) Field of Classification Search .................. 704/500
  See application file for complete search history.

(56) References Cited

U.S. PATENT DOCUMENTS

| | | | |
|---|---|---|---|
| 5,325,091 A | 6/1994 | Kaplan et al. | |
| 5,528,628 A | 6/1996 | Park et al. | |
| 5,532,694 A | 7/1996 | Mayers et al. | |
| 5,550,540 A | 8/1996 | Furlan et al. | |
| 5,550,541 A * | 8/1996 | Todd ........................... 341/51 |
| 5,717,394 A | 2/1998 | Schwartz et al. | |
| 5,721,720 A | 2/1998 | Kikuchi et al. | |
| 5,845,243 A | 12/1998 | Smart et al. | |
| 6,166,664 A | 12/2000 | Acharya | |
| 6,237,496 B1 | 5/2001 | Abbott | |
| 6,546,049 B1 | 4/2003 | Lee | |
| 6,813,438 B1 | 11/2004 | Bates et al. | |

(Continued)

FOREIGN PATENT DOCUMENTS

CN     1158050 A     8/1997

(Continued)

OTHER PUBLICATIONS

ISO/IEC 13818-7:1997(E), pp. 28, 40-44. Published 1997.*

(Continued)

*Primary Examiner*—Talivaldis Ivars Smits
*Assistant Examiner*—Matthew H Baker
(74) *Attorney, Agent, or Firm*—Laurence A Greenberg; Werner H Stemer; Ralph E Locher

(57) ABSTRACT

The present invention is based on the finding that an efficient code for encoding information values can be derived, when two or more information values are grouped in a tuple in a tuple order and when an encoding rule is used, that assigns the same code word to tuples having identical information values in different orders and that does derive an order information, indicating the tuple order, and when the code word is output in association with the order information.

23 Claims, 10 Drawing Sheets

U.S. PATENT DOCUMENTS

| | | | |
|---|---|---|---|
| 6,978,236 B1 | 12/2005 | Liljeryd et al. | |
| 7,200,275 B2* | 4/2007 | Srinivasan et al. | 382/239 |
| 7,376,555 B2 | 5/2008 | Schuijers et al. | |
| 7,426,462 B2* | 9/2008 | Young et al. | 704/200.1 |
| 7,433,824 B2 | 10/2008 | Mehrotra et al. | |
| 7,502,743 B2 | 3/2009 | Thumpudi et al. | |
| 2003/0081685 A1 | 5/2003 | Montgomery | |
| 2004/0056783 A1 | 3/2004 | Fallon | |

FOREIGN PATENT DOCUMENTS

| | | |
|---|---|---|
| EP | 0 782 341 A2 | 7/1997 |
| EP | 0 782 341 A3 | 5/1999 |
| EP | 1 047 198 A2 | 10/2000 |
| EP | 1 047 198 A3 | 1/2004 |
| RU | 2117388 C1 | 8/1998 |
| RU | 2158487 C2 | 10/2000 |
| RU | 2159507 C1 | 11/2000 |
| RU | 2214047 C2 | 10/2003 |
| SU | 1711331 A1 | 2/1992 |
| TW | 156505 | 9/1990 |
| TW | 365088 | 7/1999 |
| TW | 437187 B | 5/2001 |

OTHER PUBLICATIONS

Bosi, et al.: "ISO/IEC MPEG-2 Advanced Audio Coding", Journal of the Audio Engineering Society, New York, NY, US, vol. 45, No. 10, Oct. 1997, pp. 789-812.

Shen-Chuan Tai, et al.: "An adaptive 3-D discrete cosine transform coder for medical image compression", IEEE Transactions on Information Technology in Biomedicine IEEE USA, vol. 4, No. 3, Sep. 2000, pp. 259-263.

Faller, et al: "Binaural Cue Coding—Part II: Schemes and Applications" IEEE Transactions on Speech and Audio processing, IEEE Service Center, New York, NY, US, vol. 11, No. 6, Nov. 2003, pp. 520-531.

Yamaguchi, et al: "An efficient method for compressing test data", Proceedings of the International Test Conference ITC '97. Washington, DC, Nov. 1-6, 1997, International Test Conference, New York, NY: IEEE, US, vol. Conf. 28, Nov. 1, 1997, pp. 79-88.

Bell, et al.: "Modeling for Text Compression", ACM computing surveys, New York, NY, US, vol. 21, No. 4, Dec. 1989, pp. 557-591.

Tavakoli: "Lossless Compression of Medical Images", Computer-Based Medical Systems, 1991. Proceedings of the fourth Annual IEEE Symposium Baltimore, MD, USA, May 12-14, 1991, Los Alamitos, CA, USA, IEEE Comput. Soc., US, May 12, 1991, pp. 200-207.

Information Technology—Coding of moving Pictures and Associated Audio for Digital Storage Media and up to about 1,5-MBIT/S—Part 3: Audio; International Standard ISO/IEC, XX, XX, No. 11172-3, Aug. 1, 1993, pp. 1-158.

Faller, et al.: "Binaural Cue Coding Applied to Stereo and Multi-Channel Audio Compression", AES 112$^{th}$ Convention, Paper 5574, May 10-13, 2002, Munich, Germany, pp. 1-9.

Faller, et al.: "Binaural Cue Coding Applied to Audio Compression with Flexible Rendering", AES 113$^{th}$ Convention, Paper 5686, Oct. 5-8, 2002, Los Angeles, CA, USA, pp. 1-10.

Breebaart, et al.: "High-Quality Parametric Spatial Audio Coding at Low Bitrates", 116$^{th}$ Convention, Paper 6072, May 8-11, 2004, Berlin, Germany, pp. 1-13.

Schuijers, et al.: "Low Complexity Parametric Stereo Coding", AES 116$^{th}$ Convention, Paper 6073, May 8-11, 2004, Berlin, Germany, pp. 1-11.

Faller, et al.: "Efficient Representation of Spatial Audio Using Perceptual Parametrization", IEEE Workshop on Applications of Signal Processing to Audio and Acoustics, Oct. 21-24, 2001, New York, pp. 199-202.

Faller, et al.: "Binaural Cue Coding-Part II: Schemes and Applications", 1063-6676/03 IEEE Transactions on Speech and Audio Processing, vol. 11, No. 6, Nov. 2003, pp. 520-531.

Pattichis M.S., et al: "On the Representation of Wideband Images Using Permutations for Lossless Coding".

Vasilache, et al: "Indexing and Entropy Coding of Lattice Codevectors".

Quackenbusch, et al: "Noiseless Coding of Quantized Spectral Components in MPEG-2 Advanced Audio Coding".

Patrick Raul, et al.: "Indexing Algorithms for Zn, An, Dn, and Dn++ Lattice Vector Quantizers".

Gonzalez et al., "Digital Image Processing" International Edition, Second Edition, published in 2002, Chapter 8 (pp. 430-432; pp. 440-442; p. 458 and p. 499).

Taiwanese Office Action dated Oct. 31, 2008.
Russian Decision on Grant dated Mar. 19, 2009.
Australian Office Action dated Apr. 16, 2009.
Chinese Office Action dated May 15, 2009.
Taiwanese Office Action dated Jul. 7, 2009.
Russian Decision on Grant dated Feb. 26, 2009.
English translation of Russian Decision on Grant received Sep. 8, 2009.

* cited by examiner

ENTROPY CODING WITH COMPACT CODEBOOKS

CROSS REFERENCE TO RELATED APPLICATION

This application claims the benefit, under 35 U.S.C. §119 (e), of provisional application No. 60/670,993, filed Apr. 13, 2005.

FIELD OF THE INVENTION

The present invention relates to the encoding/decoding of information values and in particular to entropy coding using compact codebooks to generate an efficient code.

BACKGROUND OF THE INVENTION AND PRIOR ART

In recent times, the multi-channel audio reproduction technique is becoming more and more important. This may be due to the fact that audio compression/encoding techniques such as the well-known mp3 technique have made it possible to distribute audio records via the Internet or other transmission channels having a limited bandwidth. The mp3 coding technique has become so famous because of the fact that it allows distribution of all the records in a stereo format, i.e., a digital representation of the audio record including a first or left stereo channel and a second or right stereo channel.

Nevertheless, there are basic shortcomings of conventional two-channel sound systems. Therefore, the surround technique has been developed. A recommended multi-channel-surround representation includes, in addition to the two stereo channels L and R, an additional center channel C and two surround channels Ls, Rs. This reference sound format is also referred to as three/two-stereo, which means three front channels and two surround channels. Generally, five transmission channels are required. In a playback environment, at least five speakers at five decent places are needed to get an optimum sweet spot in a certain distance of the five well-placed loudspeakers.

Several techniques are known in the art for reducing the amount of data required for transmission of a multi-channel audio signal. Such techniques are called joint stereo techniques. To this end, reference is made to FIG. 9, which shows a joint stereo device 60. This device can be a device implementing e.g. intensity stereo (IS) or binaural cue coding (BCC). Such a device generally receives—as an input—at least two channels (CH1, CH2, . . . CHn), and outputs at least a single carrier channel and parametric data. The parametric data are defined such that, in a decoder, an approximation of an original channel (CH1, CH2, . . . CHn) can be calculated.

Normally, the carrier channel will include subband samples, spectral coefficients, time domain samples etc., which provide a comparatively fine representation of the underlying signal, while the parametric data do not include such samples of spectral coefficients but include control parameters for controlling a certain reconstruction algorithm such as weighting by multiplication, time shifting, frequency shifting, phase shifting, etc. The parametric data, therefore, include only a comparatively coarse representation of the signal or the associated channel. Stated in numbers, the amount of data required by a carrier channel will be in the range of 60-70 kbit/s, while the amount of data required by parametric side information for one channel will typically be in the range of 1.5-2.5 kbit/s. An example for parametric data are the well-known scale factors, intensity stereo information or binaural cue parameters as will be described below.

The BCC Technique is for example described in the AES convention paper 5574, "Binaural Cue Coding applied to Stereo and Multi-Channel Audio Compression", C. Faller, F. Baumgarte, May 2002, Munich, in the IEEE WASPAA Paper "Efficient representation of spatial audio using perceptual parametrization", October 2001, Mohonk, N.Y., in "Binaural cue coding applied to audio compression with flexible rendering", C. Faller and F. Baumgarte, AES 113th Convention, Los Angeles, Preprint 5686, October 2002 and in "Binaural cue coding—Part II: Schemes and applications", C. Faller and F. Baumgarte, IEEE Trans. on Speech and Audio Proc., volume level. 11, no. 6, November 2003.

In BCC encoding, a number of audio input channels are converted to a spectral representation using a DFT (Discrete Fourier Transform) based transform with overlapping windows. The resulting uniform spectrum is divided into non-overlapping partitions. Each partition approximately has a bandwidth proportional to the equivalent rectangular bandwidth (ERB). The BCC parameters are then estimated between two channels for each partition. These BCC parameters are normally given for each channel with respect to a reference channel and are furthermore quantized. The transmitted parameters are finally calculated in accordance with prescribed formulas (encoded), which may also depend on the specific partitions of the signal to be processed.

A number of BCC parameters do exist. The ICLD parameter, for example, describes the difference (ratio) of the energies contained in 2 compared channels. The ICC parameter (inter-channel coherence/correlation) describes the correlation between the two channels, which can be understood as the similarity of the waveforms of the two channels. The ICTD parameter (inter-channel time difference) describes a global time shift between the 2 channels whereas the IPD parameter (inter-channel phase difference) describes the same with respect to the phases of the signals.

One should be aware that, in a frame-wise processing of an audio signal, the BCC analysis is also performed frame-wise, i.e. time-varying, and also frequency-wise. This means that, for each spectral band, the BCC parameters are individually obtained. This further means that, in case a audio filter bank decomposes the input signal into for example 32 band pass signals, a BCC analysis block obtains a set of BCC parameters for each of the 32 bands.

A related technique, also known as parametric stereo, is described in J. Breebaart, S. van de Par, A. Kohlrausch, E. Schuijers, "High-Quality Parametric Spatial Audio Coding at Low Bitrates", AES 116th Convention, Berlin, Preprint 6072, May 2004, and E. Schuijers, J. Breebaart, H. Purnhagen, J. Engdegard, "Low Complexity Parametric Stereo Coding", AES 116th Convention, Berlin, Preprint 6073, May 2004.

Summarizing, recent approaches for parametric coding of multi-channel audio signals ("Spatial Audio Coding", "Binaural Cue Coding" (BCC) etc.) represent a multi-channel audio signal by means of a downmix signal (could be monophonic or comprise several channels) and parametric side information ("spatial cues") characterizing its perceived spatial sound stage. It is desirable to keep the rate of side information as low as possible in order to minimize overhead information and leave as much of the available transmission capacity for the coding of the downmix signals.

One way to keep the bit rate of the side information low is to losslessly encode the side information of a spatial audio scheme by applying, for example, entropy coding algorithms to the side information.

Lossless coding has been extensively applied in general audio coding in order to ensure an optimally compact representation for quantized spectral coefficients and other side information. Examples for appropriate encoding schemes and methods are given within the ISO/IEC standards MPEG1 part 3, MPEG2 part 7 and MPEG4 part 3.

These standards and, for example also the IEEE paper "Noiseless Coding of Quantized Spectral Coefficients in MPEG-2 Advanced Audio Coding", S. R. Quackenbush, J. D. Johnston, IEEE WASPAA, Mohonk, N.Y., October 1997 describe state of the art techniques that include the following measures to losslessly encode quantized parameters:

Multi-dimensional Huffman Coding of quantized spectral coefficients

Using a common (multi-dimensional) Huffman Codebook for sets of coefficients

Coding the value either as a hole or coding sign information and magnitude information separately (i.e. have only Huffman codebook entries for a given absolute value which reduces the necessary codebook size, "signed" vs. "unsigned" codebooks)

Using alternative codebooks of different largest absolute values (LAVs), i.e. different maximum absolute values within the parameters to be encoded Using alternative codebooks of different statistical distribution for each LAV Transmitting the choice of Huffman codebook as side information to the decoder Using "sections" to define the range of application of each selected Huffman codebook Differential encoding of scalefactors over frequency and subsequent Huffman coding of the result Another technique for the lossless encoding of coarsely quantized values into a single PCM code is proposed within the MPEG1 audio standard (called grouping within the standard and used for layer 2). This is explained in more detail within the standard ISO/IEC 11172-3:93.

The publication "Binaural cue coding—Part II: Schemes and applications", C. Faller and F. Baumgarte, IEEE Trans. on Speech and Audio Proc., volume level. 11, no. 6, November 2003 gives some information on coding of BCC parameters. It is proposed, that quantized ICLD parameters are differentially encoded over frequency and the result is subsequently Huffman encoded (with a one-dimensional Huffman code)

over time and the result is subsequently Huffman encoded (with a one-dimensional Huffman code), and that finally, the more efficient variant is selected as the representation of an original audio signal.

As mentioned above, it has been proposed to optimize compression performance by applying differential coding over frequency and, alternatively, over time and select the more efficient variant. The selected variant is then signaled to a decoder via some side information.

The prior art techniques described above are useful to reduce the amount of data that, for example, has to be transmitted during an audio- or videostream. Using the described techniques of lossless encoding based on entropy-coding schemes generally results in bit streams with a non-constant bit rate. In the AAC (Advanced Audio Codec) standard, a proposal is made to reduce both, the size of the code words and the size of the underlying codebook, by using "unsigned" codebooks, assuming that the probability distribution of the information values to be encoded only depends on the magnitudes of the values to be encoded rather than their signs. The sign bits are then transmitted separately and can be considered as a postfix code, mapping back the coded magnitude information into the actual value (sign×magnitude). Assuming for example a four-dimensional Huffman codebook, this results in saving a factor of $2^4=16$ (assuming that all values carry signs) in the size of the codebook.

Quite some efforts have already been made to reduce code size by entropy coding. Nonetheless, one still fights some major disadvantages using techniques of prior art. For example, when using multi-dimensional Huffman codebooks, one can achieve a decrease in the bit rate needed to transmit some encoded information. This is achieved at the cost of an increase in the size of the Huffman codebook that has to be used, since for each additional dimension, the Huffman codebook size increases by a factor of two. This is especially disadvantageous in applications where the Huffman codebook is transmitted together with the encoded information, as it is for example the case with some computer compression programs. Even if the Huffman codebook does not have to be transmitted with the data, it has to be stored in the encoder and in the decoder, needing expensive storage space, which is available only in limited quantities, especially in mobile applications for video or audio streaming or playback.

SUMMARY OF THE INVENTION

It is the object of the present invention to provide a concept for generation and use of a more efficient code to compress information values and to reduce the size of an underlying codebook.

According to a first aspect of the present invention, this object is achieved by an encoder for encoding information values, comprising: a grouper for grouping two or more information values into a tuple in a tuple order; a code information generator for generating order information indicating the tuple order and a code word for the tuple using an encoding rule, where the encoding rule is such that the same code word is assigned to tuples having identical information values in different orders; and an output interface for outputting the code word and in association therewith the order information.

According to a second aspect of the present invention, this object is achieved by a decoder for decoding a code word based on information values, comprising: an input interface providing the code word and in association therewith an order information indicating a tuple order, being an order of two or more information values within a tuple of information values; a code processor for deriving a tuple using a decoding rule depending on an encoding rule used to create the code word, where the decoding rule is such that different tuples are derived from the same code word, the different tuples having the same information values in different tuple orders, as indicated by differing order information; and a degrouper for degrouping the tuples into two or more information values.

According to a third aspect of the present invention, this object is achieved by a method for encoding information values, the method comprising: grouping two or more information values into a tuple in a tuple order; generating order information indicating the tuple order; generating a code word for the tuple using an encoding rule, where the encoding rule is such that the same code word is assigned to tuples having identical information values in different orders; and outputting the code word and in association therewith the order information.

According to a fourth aspect of the present invention, this object is achieved by a computer program implementing the above method, when running on a computer.

According to a fifth aspect of the present invention, this object is achieved by a method for decoding code words based on information values, the method comprising: providing the code word and in association therewith an order information indicating a tuple order, being an order of two or more information values within a tuple of information values; deriving a tuple using a decoding rule depending on an encoding rule used to create the code word, where the decoding rule is such that different tuples are derived from the same code word, the different tuples having the same information values in different tuple orders, as indicated by differing order information; and degrouping the tuples into two or more information values.

According to a sixth aspect of the present invention, this object is achieved by a computer program implementing the above method, when running on a computer.

According to a seventh aspect of the present invention, this object is achieved by encoded data based on information values, the encoded data comprising a code word for a tuple of two or more information values arranged in the tuple in a tuple order and an order information indicating the tuple order.

The present invention is based on the finding that an efficient code for encoding information values can be derived, when two or more information values are grouped in a tuple in a tuple order and when an encoding rule is used, that assigns the same code word to tuples having identical information values in different orders and when an order information, indicating the tuple order, is derived and associated to the code word.

For entropy coding using Huffman codes, the inventive concept described above can be implemented more efficiently. The size of a Huffman codebook depends as well on the number of possible values to be coded as on the number of jointly coded values (dimension of the Huffman codebook). In order to reduce the required storage space needed to represent a Huffman codebook in a specific application, it is advantageous to exploit symmetries in the probability distribution of the data to be coded such that one Huffman codeword represents a whole set of groups of jointly coded values with equal probability. The actual group of jointly coded values is specified by a particular postfix code then.

Since the order of two or more values in a tuple is not dependent on the content represented by the values, when the values are to a certain degree uncorrelated, equal probabilities for different orders of the same values can be assumed (since the values are uncorrelated). Particularly and preferably for a variable length code, i.e. a code having code words with different lengths, these equal probabilities will result in a smaller codebook and an efficient code, when the tuples with different orders of the same values are assigned to a single code word.

Therefore, in a preferred embodiment of the present invention, the information values that are to be encoded by a two-dimensional Huffman encoder are differentially encoded first, resulting in a differential representation having certain symmetries as explained later in more detail. After that, a number of symmetry operations are applied to the differential representation, reducing the number of possible tuples to be encoded, thus also reducing the size of the required codebook.

Differentially encoding a distribution of values, occurring with a given probability distribution will result in a distribution of difference values that is centered around zero, having a probability distribution that is symmetric, i.e. values of the same absolute value but with different signs will occur with the same probability.

The basic principle of entropy coding, as for example Huffman coding, is, that the used codebook represents a given probability distribution of information values as good as possible in view of assigning the shortest possible code words to the information values occurring at most. Multi-dimensional Huffman coding follows the same principle but combines two or more information values into a tuple, wherein the whole tuple is then associated with a single codeword.

Therefore, combining differential encoding with two-dimensional Huffman encoding yields two types of symmetries, that can be made use of.

The first symmetry derives from the observation that the probability of occurrence of the tuple (a, b) is approximately the same as for the tuple (−a, −b). This corresponds to a point symmetry relative to the origin of a coordinate system, where the first value of a tuple defines the X-axis and the second value of a tuple defines the Y-axis.

The second symmetry is based on the assumption, that changing the order in which the two values in a tuple occur does not change the tuple's probability of occurrence, i.e. that (a, b) and (b, a) are equally probable. This corresponds to an axis symmetry relative to the bisectors of the coordinate systems first and third quadrant, when the coordinate system is defined as explained above.

The two symmetries can be exploited such, that the size of a Huffman codebook is reduced by a factor of 4, meaning that symmetrical tuples are assigned the same codeword. The symmetry information, i.e. the order of the original tuple and the sign of the original tuple, are indicated by an order information and a sign information and transmitted together with the codeword to allow for decoding and a reconstruction of the original tuple including the sign and the order information.

Recalling the above representation of the tuples within a two-dimensional coordinate system, both symmetries together can be understood as a 2-dimensional probability distribution with level curves (curves of equal probabilities) resembling ovals with the principle axis rotated by 45 degrees relative to the Cartesian coordinate system.

Making use of the two symmetries, only approximately one forth (1 quadrant) of the possible entries within the coordinate system has to be covered by Huffman codes. A two-bit postfix code determines a unique mapping between every pair of values in one of four quadrants and its corresponding pairs of values in the remaining three quadrants. Note that for pairs of values situated on either quadrant borderline, the postfix code consists of one bit only or can even be omitted in case of the pair of values situated on both border lines, i.e. in the center of the distribution.

The inventive concept will reduce the size of the Huffman codebook for data that is not showing the symmetries described above. If such data is encoded, on the one hand the size of the Huffman codebook will be small, but on the other hand the encoded representation might not be ideally compressed, since values occurring with different probabilities are represented by the same codeword, leading to a waste of bit rate since the Huffman codebook cannot be tuned to fit the data in an optimal way.

Therefore, it is preferred that the data is differentially encoded before applying symmetry treatments, since the differential encoding automatically yields advantageous symmetries. Thus, the inventive concept can be used assuring a compact representation and a small Huffman codebook for every underlying set of information values, since the disadvantage of doubling the number of possible information values by differentialy encoding the information values can be balanced by using the symmetries.

BRIEF DESCRIPTION OF THE DRAWINGS

Preferred embodiments of the present invention are subsequently described by referring to the enclosed drawings, wherein.

DETAILED DESCRIPTION OF THE PREFERRED EMBODIMENTS

Figure 1:
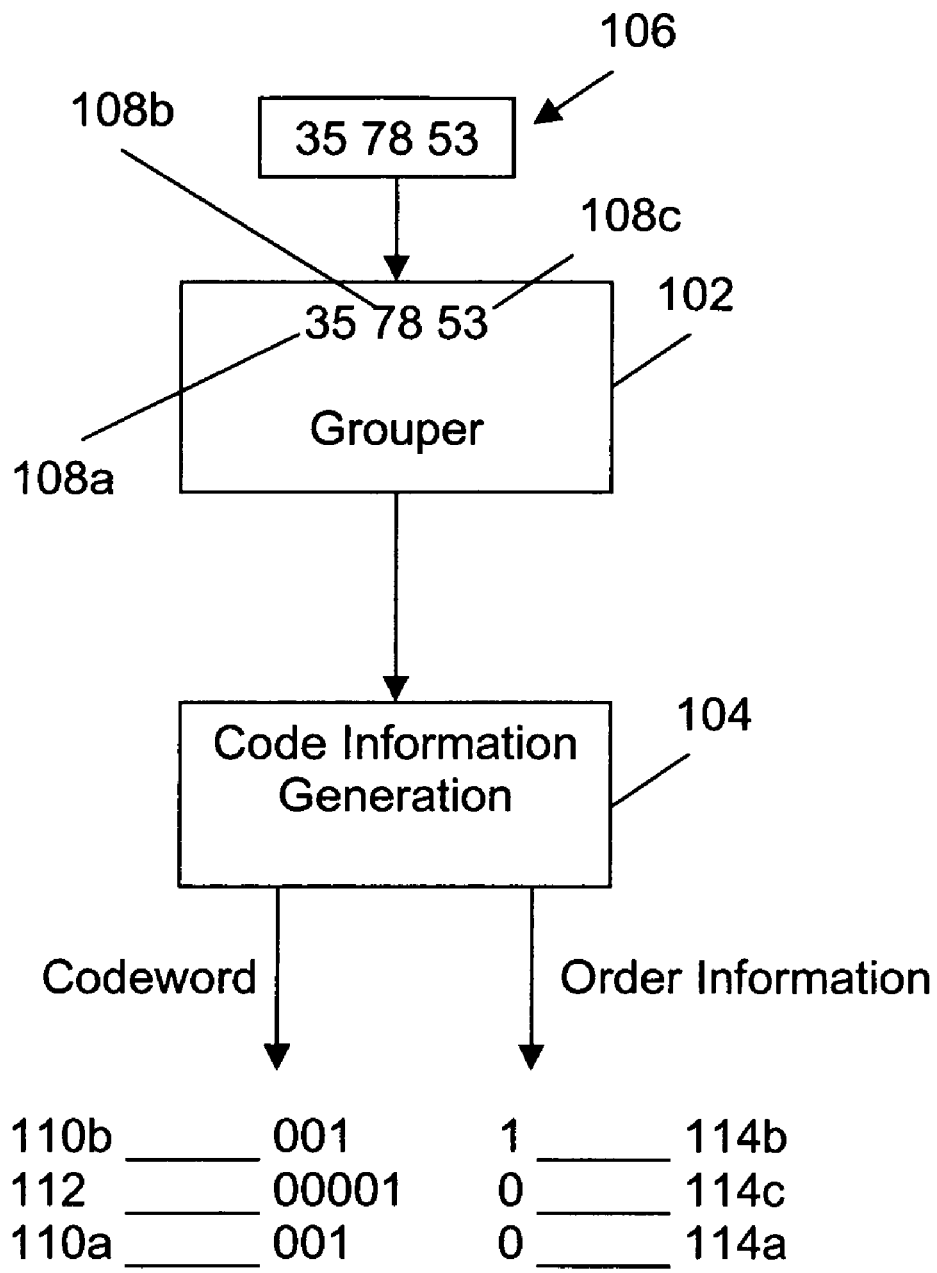
FIG. 1 shows a block diagram of an inventive encoder.

FIG. 1 shows an inventive encoder 100, the encoder 100 comprising a grouper 102 and a code information generator 104, that includes an output interface.

The information values 106 are grouped in tuples of information values 108a to 108c by the grouper. In the example shown in FIG. 1, the inventive concept is described by building tuples consisting of two information values each, i.e. by using a two-dimensional Huffman code.

The tuples 108a to 108c are transferred to the code information generator 104, wherein the code information generator implements an encoding rule that assigns the same codeword to tuples having identical information values in different orders. Therefore, the tuples 108a and 108c are encoded into the same code words 110a and 110b, whereas the tuple 108b is encoded into a different codeword 112. According to the inventive concept, differing order information 114a and 114b is generated to preserve the information of the order in which the information values are grouped inside the tuples 108a and 108c. A combination of the order information and the codeword can therefore be used to reconstruct the original tuples 108a and 108c, hence the order information is delivered in association with the codeword by the output interface. Generally, one may agree on different ordering schemes resulting in differing order information bits. In the example shown in FIG. 1, the tuples are not reordered when the values within the tuples occur in ascending order, as it is the case for the tuples 108a and 108b. If one further agrees on assigning a order information of 0 to tuples that have not been reordered, one results in the order information values as they have been assigned to the codewords in FIG. 1.

Figure 2:
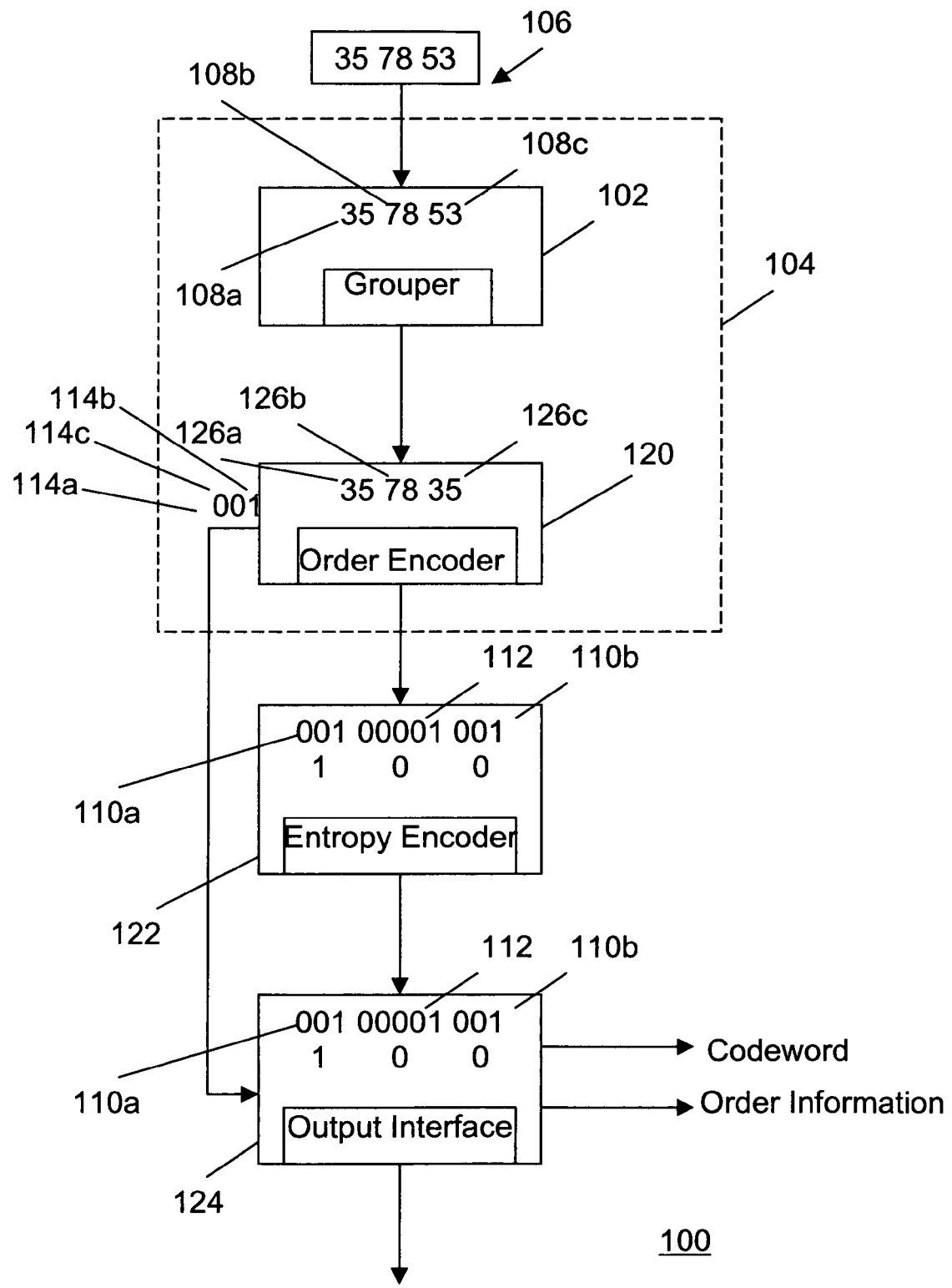
FIG. 2 shows a preferred embodiment of an inventive encoder.

FIG. 2 shows a preferred embodiment of the present invention, in which the code information generator 104 comprises an order encoder 120 and an entropy encoder 122 and wherein the encoder 100 further comprises an output interface 124.

The order encoder 120 generates the order information 114a to 114c of the tuples (indicating the tuple order) and transfers the order information to the output interface 124. At the same time, the order encoder 120 reorders the information values within the tuples 108a to 108c to derive the tuples 126a to 126c changing the tuple order to a predefined tuple order, the predefined tuple order defining an encoding order of information values for groups of tuples having identical information values.

The reordering can for example be done, also for tuples having more than two information values, by multiple subsequent steps of exchanging the position of two information values within the tuple. After each step, it is checked, whether there exists an entry in the codebook of the order encoder for the given tuple order. If this is the case, the reordering can be stopped and the code word can be generated. If not, the above procedure is repeated until the codeword is found. The order information can then, for example, be derived from the number of exchanges necessary to derive the codeword. Similarly, the correct tuple order could be rearranged using the order information on a decoder side.

The entropy coder encodes the tuples 126a to 126c to derive the code words 110a, 110b, and 112 and transfers these code words to the output interface 124.

The output interface finally outputs the code words 110a, 110b, and 112 and in association therewith the order information 114a to 114c.

Figure 3:
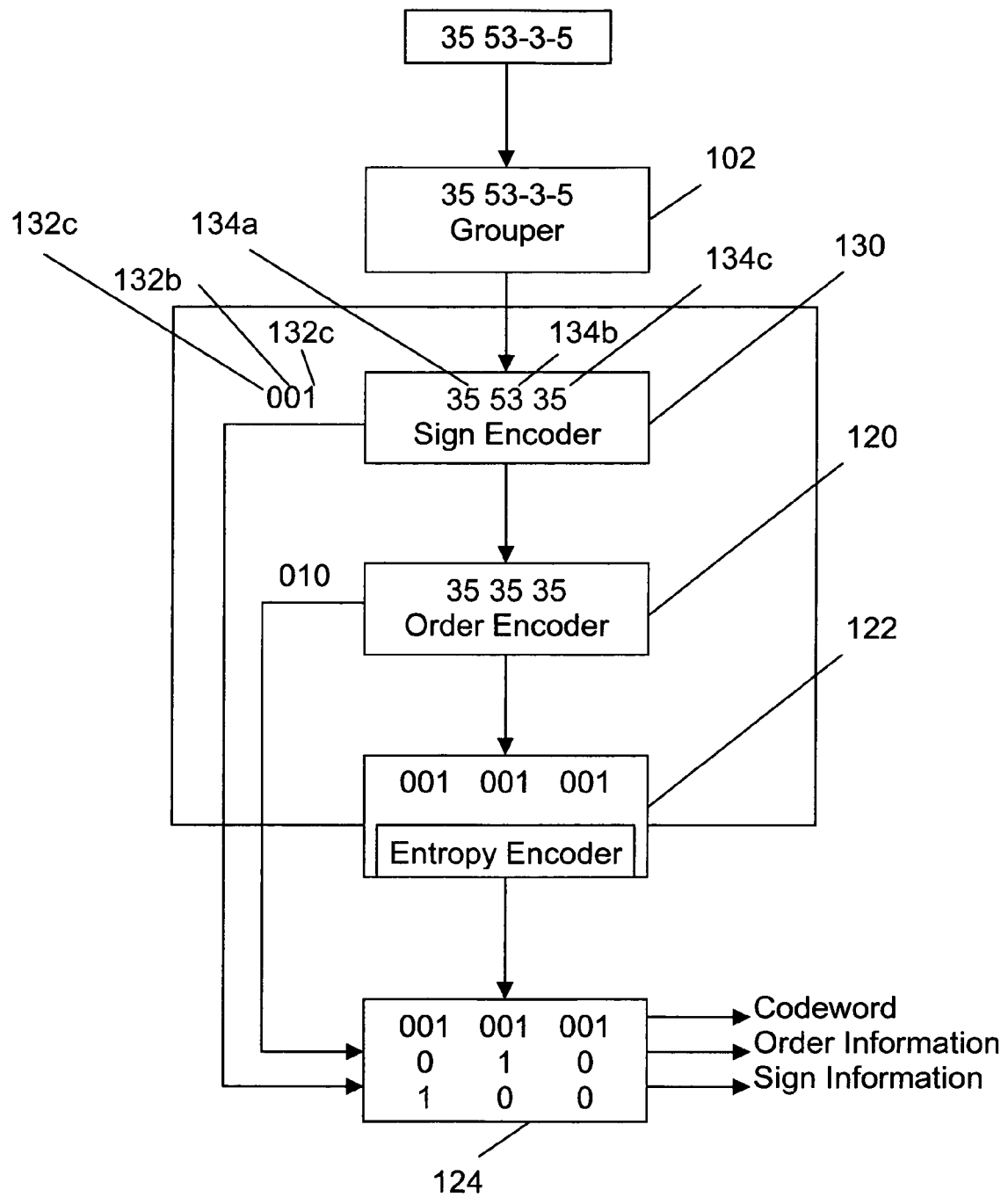
FIG. 3 shows a further preferred embodiment of an inventive encoder.

FIG. 3 shows another preferred embodiment of the present invention, wherein the code information generator further comprises a sign encoder 130 for deriving a sign information indicating a sign combination of the information values within the tuple.

The inventive encoder shown in FIG. 3 makes also use of the second symmetry, assigning the same code words to tuples having information values of same absolute value and in the same order regarding their absolute values. Therefore, the sign encoder 130 derives a sign information 132a to 132c for each of the tuples 134a to 134c, indicating the sign of the values within the tuples. The sign encoder 130 simultaneously changes the signs of the information values within the tuples to derive a predefined sign combination, defining an encoding sign combination for each order of absolute values within the tuple, i.e. for tuples differing only in the signs of the information values.

The sign information 132a to 132c is additionally transferred to the output interface 124 that also receives order information from the order encoder 120 and the code words from the entropy encoder 122. The output interface 124 then supplies the code words and in association therewith the order information and the sign information.

Figure 4A:
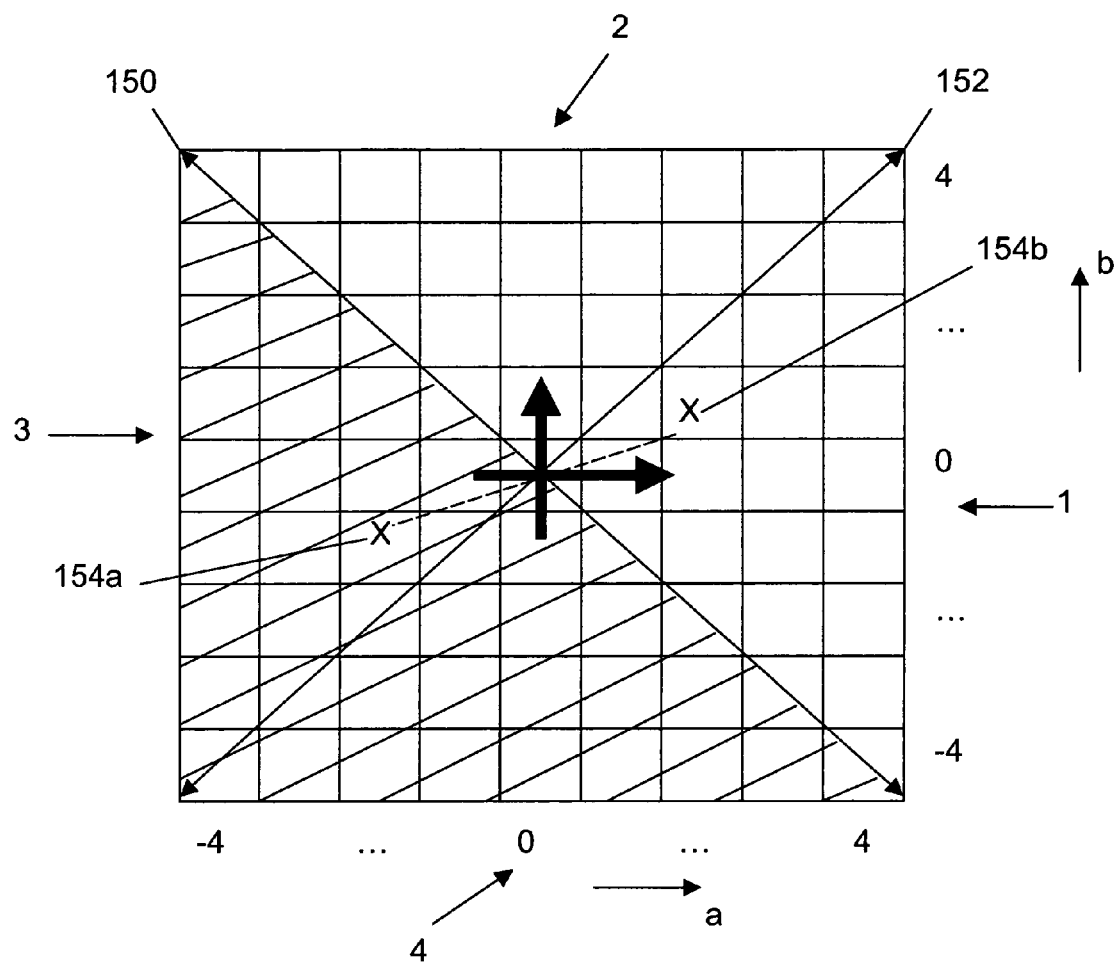
FIG. 4a shows a first symmetry operation on data to be encoded.

FIG. 4a shows, how the sign information can be derived by the sign encoder 130 and how the symmetry regarding the signs can be used to reduce the size of a required Huffman codebook.

Shown are the possible values of a tuple (a, b), graphically represented by a matrix, wherein the values for a are shown on the X-axis and the possible values for b as shown on the Y-axis. The values for a and b are symmetrized around zero (for example by a previous differential encoding) and are ranging from −4 to 4 each.

The matrix is showing all the 81 possible combinations of the parameter values a and b. Indicated is also a first axis 150, indicating the entries of the matrix, where the sum of a and b (a+b) equals zero. The figure further shows a second axis 152, where the difference of a and b (a−b) equals zero. As can be seen, the two axes 150 and 152 divide the matrix into four quadrants labeled with numbers 1 to 4.

The first symmetry, assuming that a combination (a, b) and a combination (−a, −b) are equally probable, is equal to a point symmetry to the origin, which is explicitly shown for two arbitrary entries 154a and 154b of the matrix An inventive encoder can reduce the size of a required Huffman codebook by a factor of approximately 2 by performing a symmetry operation, mirroring the entries of the third quadrant to the first quadrant and the entries of the fourth quadrant to the second quadrant. Such, the codebook entries of the third and forth quadrant can be saved, when the sign encoder 130 additionally indicates by the sign information from which quadrant the tuple was coming.

Figure 4B:
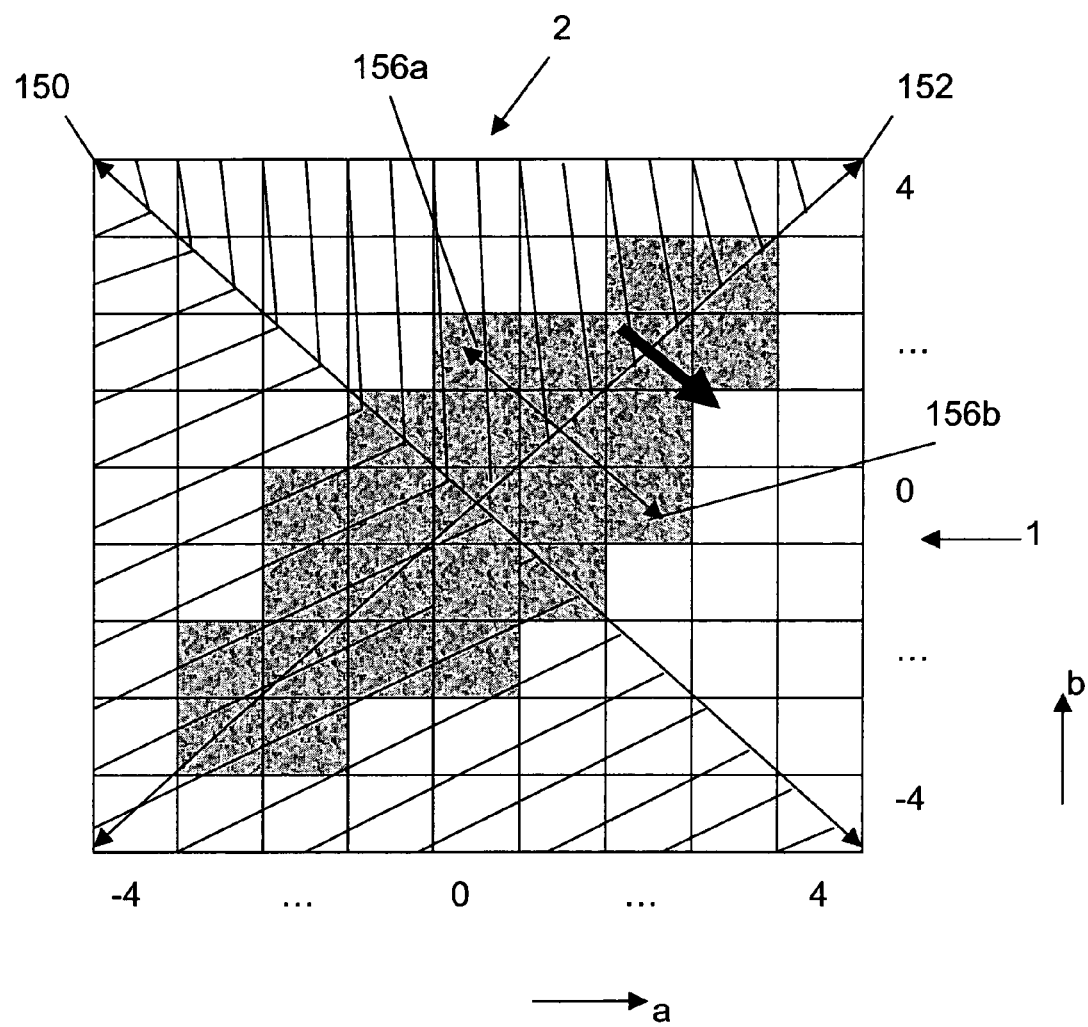
FIG. 4b shows a second symmetry operation on data to be encoded.

FIG. 4b shows, how the second symmetry can be made use of by the order coder 120 to reduce the size of the Huffman codebook by another factor of approximately 2. The second symmetry, meaning that tuples (a, b) and (b, a) are equally probable, is equal to a mirroring of the remaining matrix entries at the axis 152. This is for example shown for the two matrix entries 156a and 156b, showing the mirroring of the tuple (0, 2) to the tuple (2,0). Therefore, by assigning corresponding entries of the second and of the first quadrant the same code words, one can save another factor of 2 in the codebook size. The order coder 120 derives the order information to preserve the information, whether the original tuple was from the first or from the second quadrant.

As illustrated by FIGS. 4a and 4b, an inventive encoder incorporating a sign encoder and an order encoder allows that only one out of four quadrants has to be covered by Huffman codes. A two-bit postfix code determines a unique mapping between every pair of values in one of the four quadrants and its corresponding pair of values in the remaining three quadrants. Note that for pairs of values situated on either quadrant borderline, the postfix code consists of one bit only or can even be omitted in case of the pair of values situated on both borderlines, i.e. at the center of the matrix.

Following the symmetry operations shown in FIGS. 4a and 4b, it can be fortunate to reorder (map) the pairs of values in the remaining quadrant into a quadratic matrix for practical reasons, since running an algorithm on a quadratic representation is much more convenient.

Figure 5:
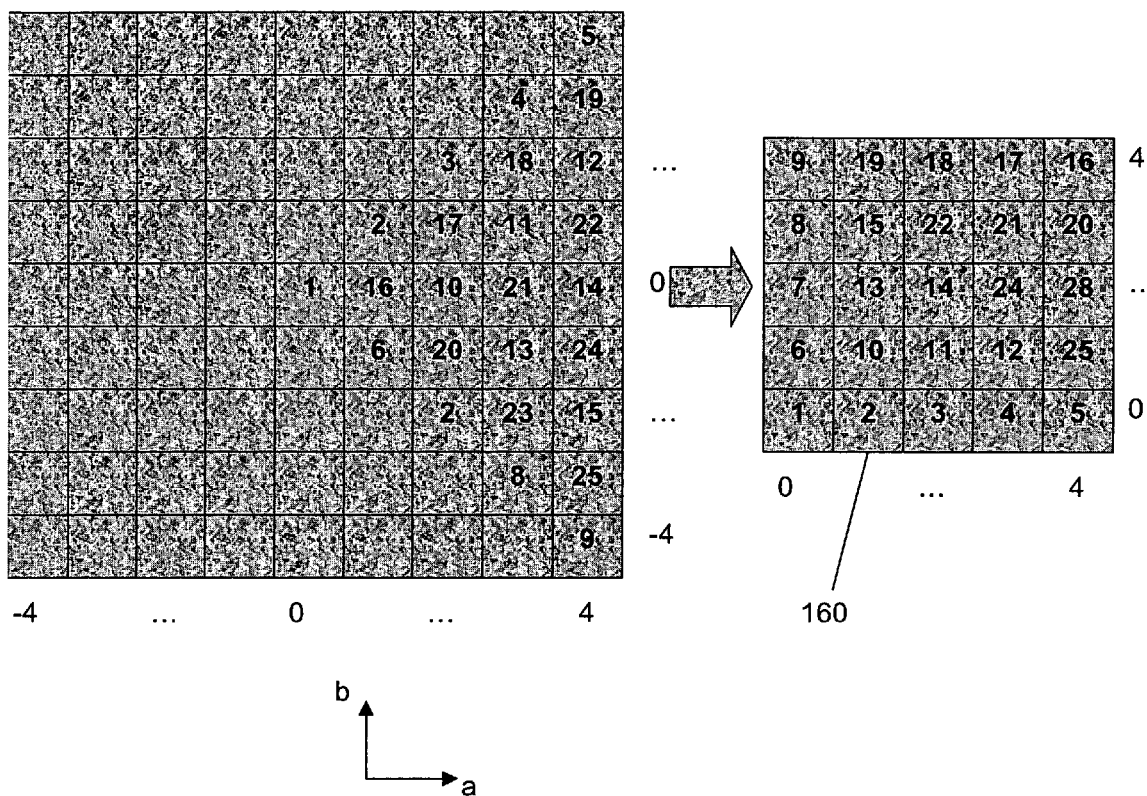
FIG. 5 shows the derivation of a symmetric representation of data.

A mapping strategy incorporated by one embodiment of the present invention is shown in FIG. 5. The original matrix with the first quadrant to be mapped to a quadratic matrix 160 is shown to the left. The quadratic matrix 160 also has parameter values for parameter a on the X-axis and parameter values for parameter b on the Y-axis. The reordering following the mapping algorithm is indicated in the drawing, where each of the matrix elements is marked with a unique number. It is to be noted, that tuples whose information values sum to an even number (a+b is even, which is true for all non hatched matrix elements of the first quadrant) are reordered to the lower left side of the quadratic matrix 160, whereas tuples having odd sums of information values (hatched elements) are reordered to the upper right side of the matrix 160, being hatched in FIG. 5.

After the above mapping process, the tuples to be Huffman encoded are given in a quadratic representation and thus are easy to handle.

Figure 6:
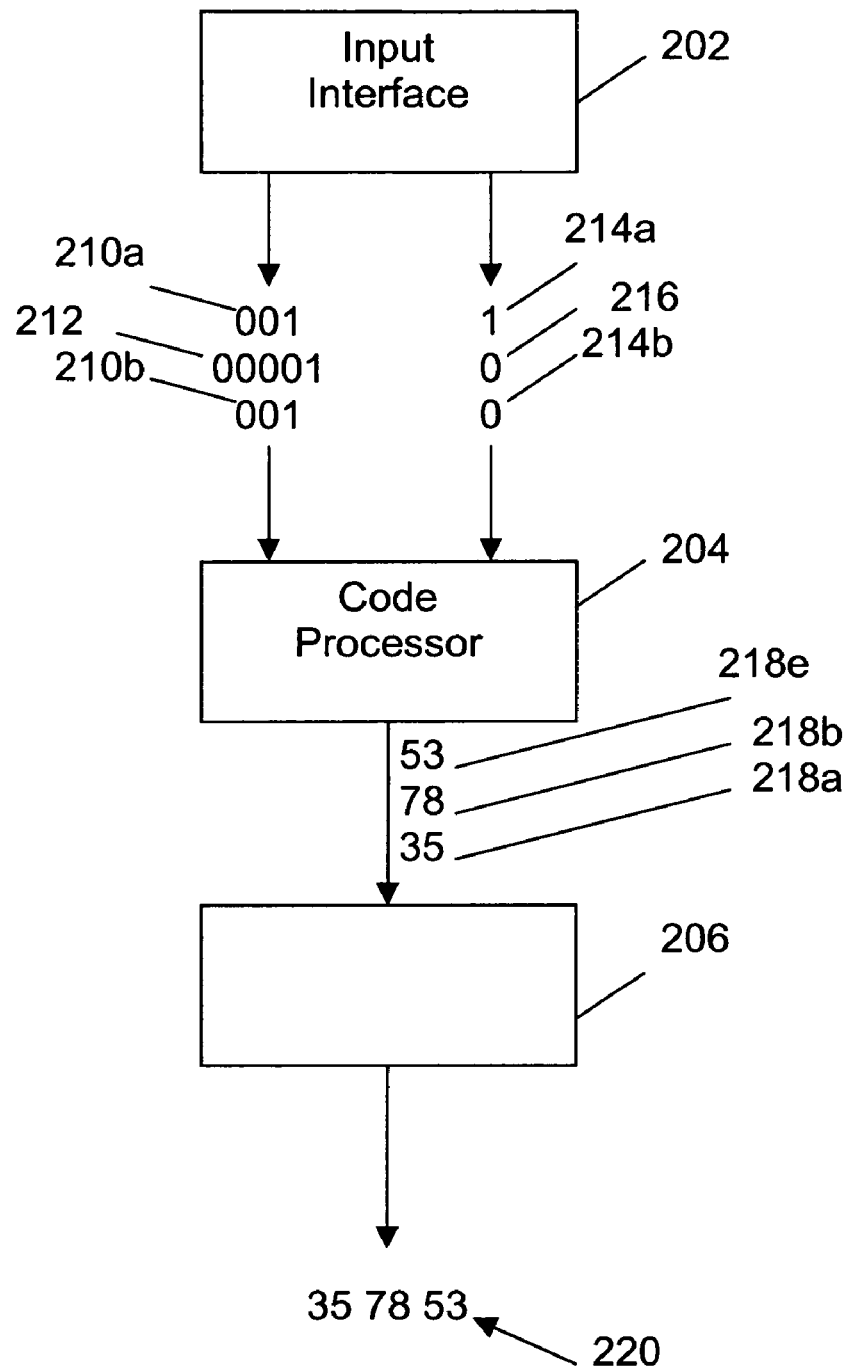
FIG. 6 shows a block diagram of an inventive decoder.

FIG. 6 shows a block diagram of an inventive decoder for decoding code words that are based on information values.

The decoder 200 comprises an input interface 202, a code processor 204, and a degrouper 206. The input interface 202 provides code words 210a, 210b and 212 and associated therewith order information 214a, 214b and 216, both are transferred to the code processor 204.

The code processor derives tuples of information values 218a, 218b, and 218c using a decoding rule, where the decoding rule is such, that different tuples are derived from the same code word, the different tuples having the same information values in different tuple orders, as indicated by a differing order information.

Therefore, the differing tuples 218a, and 218c are derived from the same code words 210a and 210b, since having associated different order information 214a and 214b. The tuples of information values 218a to 218c are then degrouped by the degrouper 206 to yield the information values 220.

Figure 7:
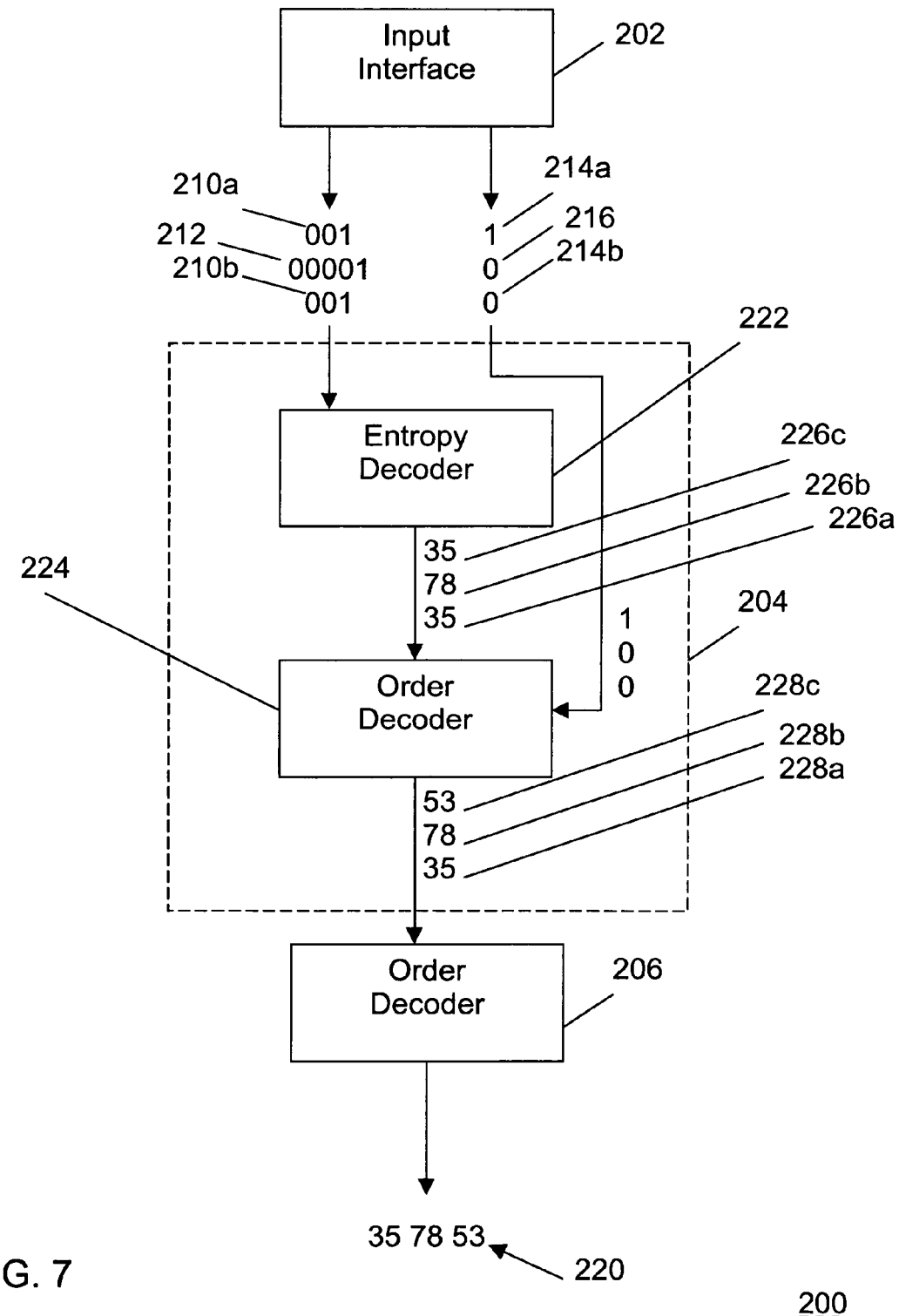
FIG. 7 shows a preferred embodiment of an inventive decoder.

FIG. 7 shows a preferred inventive decoder, wherein the code processor 204 includes an entropy decoder 222 and an order decoder 224.

The entropy decoder 222 assigns, using a Huffman codebook, each of the code words 210a, 210b, and 212 to one tuple 226a to 226c. The tuples 226a to 226c are transferred to the order decoder 224 that also receives the associating order information. The order decoder 224 derives the information values modifying the tuples 226a to 226c, as indicated by the order information. The derived final tuples 228a to 228c are then transferred to the degrouper 206, that degroups the tuples 228a to 228c to derive the information values 220.

Figure 8:
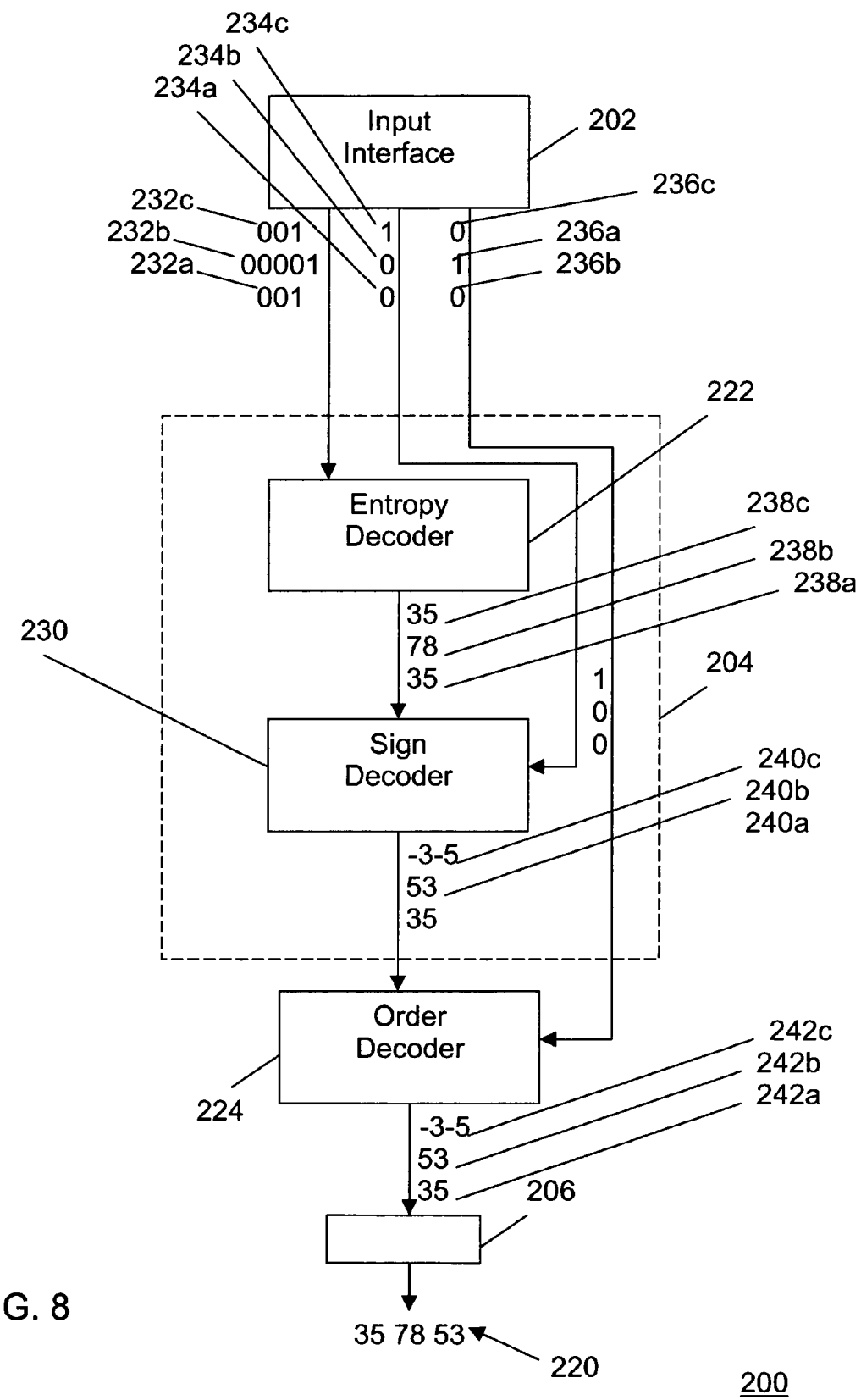
FIG. 8 shows a further preferred embodiment of an inventive decoder.
Figure 9:
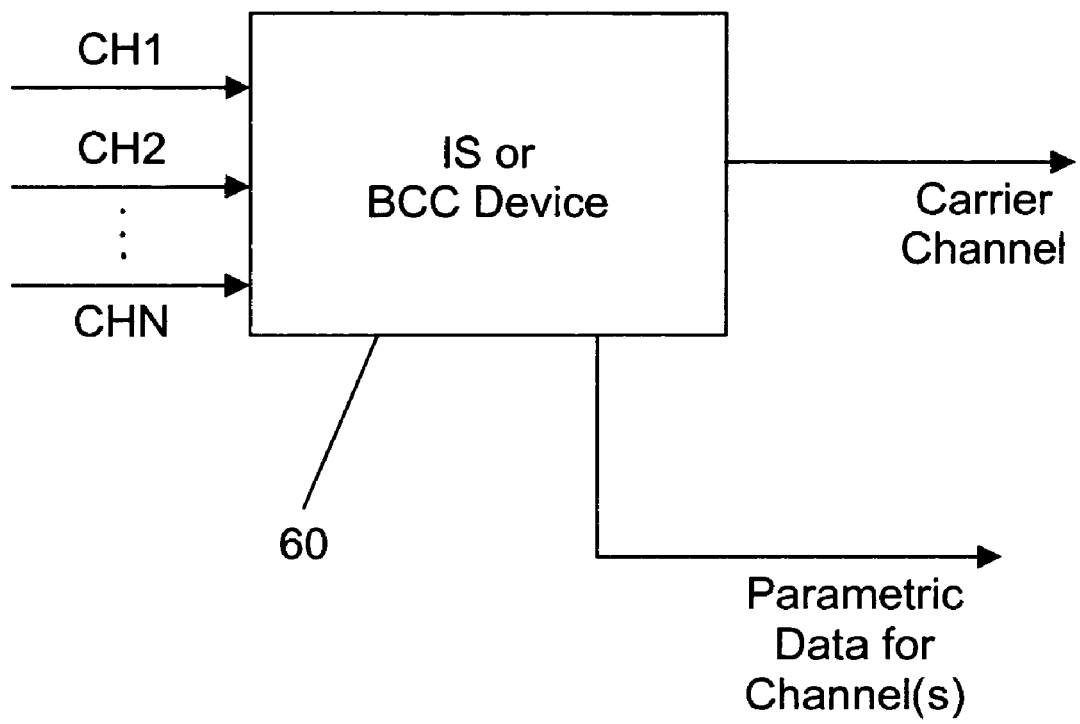
FIG. 9 shows a prior art multi-channel encoder.

FIG. 8 shows another preferred embodiment of an inventive decoder 200, where the code processor 204 further includes a sign decoder 230.

The input interface provides three identical code words 232a to 232c, sign information bits 234a to 234c and order information bits 236a to 236c.

The entropy decoder 222 decodes the three identical code words 232a to 232c into three identical tuples 238a to 238c, which are then transferred to the sign decoder 230.

The sign decoder 230 additionally receives the sign information 234a to 234c and modifies the tuples 238a to 238c, as indicated by the sign information 234a to 234c, to derive the tuples 240a to 240c, that are now having information values with correct signs.

The tuples 240a to 240c are transferred to the order decoder 224, that additionally receives the order information 236a to 236c, and that alters the order of information values within the tuples 204a to 240c to receive the correctly ordered tuples 242a to 242c. The tuples 242a to 242c are then transferred to the degrouper 206, that derives the information values 220 by degrouping the tuples 242a to 242c.

Although the preferred embodiments of inventive encoders shown in the FIGS. 2 and 3 propose, that the order encoder 120 and the sign encoder 130 retrieve the order or sign information and do simultaneously alter the tuples, it is alternatively possible that the sign encoder and the order encoder retrieve the order and sign information without altering the tuples. A Huffman Codebook has to be designed such then, that tuples with different sign and order informations are assigned the same code words.

Although the preferred embodiments shown in the figures detail the concept of the present invention by using two-dimensional Huffman codebooks, the inventive idea of using grouped values and making use of their symmetries can also be combined with other lossless encoding methods, especially with Huffman codebooks of higher dimensions, i.e. building tuples having more information values than two.

FIGS. 4a and 4b show a way to derive the symmetry information used to allow for a smaller Huffman codebook. In a first step the third and forth quadrant of a given matrix is mapped to the first and second quadrant. It is alternatively also possible to map other combinations of two neighboring quadrants to the remaining two quadrants, as long as the symmetry information is preserved such that the mapping can be reversed. The same is also true for the second symmetry operation shown in FIG. 4b.

FIG. 5 shows a way of mapping one quadrant of a matrix into a quadratic matrix allowing to conveniently use describing a codebook of reduced size. This mapping is an example for multiple possible mapping schemes, wherein the mappings only have to be such that they are unique and can be reversed.

Depending on certain implementation requirements of the inventive methods, the inventive methods can be implemented in hardware or in a computer program. The implementation can be performed using a digital storage medium, in particular a disk, DVD or a CD having electronically readable control signals stored thereon, which cooperate with a programmable computer system such that the inventive methods are performed. Generally, the present invention is, therefore, a computer program product with a program code stored on a digital storage medium, the program code being operative for performing the inventive methods when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

We claim:

1. A hardware encoder for encoding information values, comprising:
    a differential encoder for differential encoding of input values to obtain a differentially encoded representation of the input values as information values, wherein the input values include information values describing a video signal or an audio signal;
    a grouper for grouping two information values into a tuple in a tuple order, said information values describing a video signal or an audio signal;
    a code information generator for generating order information indicating the tuple order and a code word for the tuple using an encoding rule, where the encoding rule is such that the same code word is assigned to different tuples having the same information values in different orders, the encoding rule further being such that, the same code word is only assigned to different tuples having information values of the same absolute value in the same order differing by a common sign flip of each information value in the tuple;
    a sign encoder to derive a sign information indicating a sign combination of the information values within the tuple; and
    an output interface for outputting the code word and in association therewith the order information and the sign information.

2. The hardware encoder of claim 1, in which the code information generator includes an order encoder for deriving the order information and an entropy encoder for deriving the code word using a codebook that assigns tuples having identical information values in different orders to the same code word.

3. The hardware encoder of claim 2, in which the order encoder is operative to reorder the information values within the tuple to change the tuple order to a predefined tuple order for the tuple, the predefined tuple order defining an encoding order of information values for groups of tuples having identical information values and in which the order encoder is operative to detect and encode a deviation of the tuple order and the encoding order; and
    in which the entropy encoder is having a reduced codebook assigning a code word to tuples having information values ordered in the encoding order.

4. The hardware encoder of claim 3, in which the order encoder is operative to reorder the information values within the tuple by exchanging a first information value with a second information value.

5. The hardware encoder of claim 4, in which
    the sign encoder is operative to change the signs of the information values within the tuple to change a sign combination to a predefined sign combination, the predefined sign combination defining an encoding sign combination for an order of information values within the tuple differing only in the individual signs of the information values; and
    the code information generator is having an entropy encoder, the entropy encoder having a reduced codebook, assigning the same code word to each tuple having the same order of absolute values of information values.

6. The hardware encoder of claim 5, in which the sign encoder is operative to change the sign of a first and of a second information value within a tuple.

7. The hardware encoder of claim 1, in which the differentially encoded representation is a representation of the input values differentially encoded in time or in frequency.

8. The hardware encoder of claim 1, in which the information values comprise information values describing a frame of a video signal or an audio signal.

9. The hardware encoder of claim 1, in which the information values comprise BCC parameters describing a spatial correlation between a first and a second audio channel and in which the BCC Parameters are chosen from the following list of BCC parameters:
    inter-channel coherence (ICC),
    inter-channel level difference (ICLD),
    inter-channel time difference (ICTD),
    inter-channel phase difference (IPD).

10. The hardware encoder of claim 1, in which the encoding rule is such, that an encoding of information values results in a sequence of code words having different lengths.

11. A hardware decoder decoding a code word based on information values, comprising:
    an input interface for providing the code word and in association therewith an order information indicating a tuple order, being an order of two information values within a tuple of information values and in further association, a sign information, indicating a sign combination for the information values within the tuple, the information values describing a video signal or an audio signal; and
    a code processor for deriving the tuple using a decoding rule depending on an encoding rule used to create the code word, the decoding rule being such, that different tuples having the same information values in different orders are derived from the same code word when it is associated by different order information and that only different tuples having information values of the same absolute value in the same order differing by a common sign flip of each information value in the tuple are derived form the same code word when it is associated by different sign information; and
    a differential decoder for differential decoding of the information values to obtain a differentially decoded representation of the information values, the information values describing a video signal or an audio signal.

12. The hardware decoder of claim 11, in which the code processor includes
    an entropy decoder for deriving a preliminary tuple using a codebook assigning each code-word to a preliminary tuple; and
    an order decoder for deriving the tuple by reordering the information values within the preliminary tuple as indicated by the order information.

13. The hardware decoder of claim 12, in which the order decoder is operative to reorder the information values of the preliminary tuple by exchanging a first information value with a second information value.

14. The hardware decoder of claim 13, in which
    the code processor further includes a sign decoder to derive the tuple from the preliminary tuple by changing the signs of the information values within the preliminary tuple as indicated by the sign information.

15. The hardware decoder of claim 14, in which the sign decoder is operative to change the signs of each information value within the preliminary tuple.

16. The hardware decoder of claim 14, in which the sign decoder is operative to change the sign of a first and of a second information value within the preliminary tuple.

17. The hardware decoder of claim 11, in which the differentially decoded representation of the information values is differentially decoded in time or in frequency.

18. The hardware decoder of 11, in which the information values comprise information values describing a frame of a video signal or an audio signal.

19. The hardware decoder of claim 11, in which the information values comprise BCC parameters describing a spatial correlation between a first and a second audio channel and in which the BCC Parameters are chosen from the following list of BCC parameters:
    inter-channel coherence (ICC),
    inter-channel level difference (ICLD),
    inter-channel time difference (ICTD),
    inter-channel phase difference (IPD).

20. A method for encoding information values, the method comprising:
    differentially encoding, using a differential encoder, input values to obtain a differentially encoded representation of the input values as the information values, the input values including information values describing a video signal or an audio signal;
    grouping, using a grouper, two or more information values into a tuple in a tuple order;
    generating, using a code information generator, order information indicating the tuple order;
    generating, using a sign encoder, sign information indicating a sign of the information values within the tuple;
    generating, using a code information generator, a code word for the tuple using an encoding rule, where the encoding rule is such that the same code word is assigned to different tuples having the same information values in different orders, the encoding rule being such that, the same code word is only assigned to different tuples having information values of the same absolute value in the same order differing by a common sign flip of each information value in the tuple; and
    outputting, using an output interface, the code word and in association therewith the order information and the sign information.

21. A method for decoding code words based on information values, the method comprising:
    providing, using an input interface, the code word and in association therewith an order information indicating a tuple order, being an order of two information values within a tuple of information values, and in further association, a sign information indicating a sign combination for the information values within a tuple, the information values describing a video signal or an audio signal;
    deriving, using a code processor, a tuple using a decoding rule depending on an encoding rule used to create the code word, where the decoding rule is such, that different tuples having the same information values in different orders are derived from the same code word when it is associated by different order information, and that only different tuples having information values of the same absolute value in the same order differing by a common sign flip of each information value in the tuple are derived from the same code word when it is associated by different sign information;
    degrouping, using a degrouper, the tuples into two or more information values; and
    differential decoding, using a differential decoder, the information values to obtain a differentially decoded representation of the information values.

22. A machine readable medium having stored thereon a computer program having a program code for performing, when running on a computer, a method for encoding information values, the method comprising:
    differentially encoding of input values to obtain a differentially encoded representation of the input values as the information values, the input values including information values describing a video signal or an audio signal;
    grouping two or more information values into a tuple in a tuple order;
    generating order information indicating the tuple order;
    generating sign information indicating a sign of the information values within the tuple;
    generating a code word for the tuple using an encoding rule, where the encoding rule is such that the same code word is assigned to different tuples having the same information values in different orders, the encoding rule being such that the same code word is only assigned to different tuples having information values of the same absolute value in the same order differing by a common sign flip of each information value in the tuple; and
    outputting the code word and in association therewith the order information and the sign information.

23. A machine readable medium having stored thereon a computer program having a program code for performing, when running on a computer, a method for decoding code words based on information values, the method comprising:
    providing the code word and in association therewith an order information indicating a tuple order, being an order of two information values within a tuple of information values and in further association a sign information, indicating a sign combination for the information values with a tuple, the information values describing a video signal or an audio signal;
    deriving a tuple using a decoding rule depending on an encoding rule used to create the code word, where the decoding rule is such, that different tuples having the same information values in different orders are derived from the same code word when it is associated by different order information and that only different tuples having information values of the same absolute value in the same order differing by a common sign flip of each information value in the tuple are derived from the same code word when it is associated by different sign information;

degrouping the tuples into two or more information values; and differential decoding of the information values to obtain a differentially decoded representation of the information values.

* * * * *